US012792068B2

(12) United States Patent
Senn et al.

(10) Patent No.: US 12,792,068 B2
(45) Date of Patent: Nov. 10, 2026

(54) COMPOSITION MIXTURE CONTROL OF EFEM ENVIRONMENT

(71) Applicant: LAM RESEARCH CORPORATION, Fremont, CA (US)

(72) Inventors: Brandon Senn, Molalla, OR (US); Scott Vernon Wong, Mountain View, CA (US); Travis R. Taylor, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/725,961

(22) PCT Filed: Dec. 13, 2022

(86) PCT No.: PCT/US2022/052684
§ 371 (c)(1),
(2) Date: Jul. 1, 2024

(87) PCT Pub. No.: WO2023/132916
PCT Pub. Date: Jul. 13, 2023

(65) Prior Publication Data

US 2025/0093890 A1 Mar. 20, 2025

Related U.S. Application Data

(60) Provisional application No. 63/297,360, filed on Jan. 7, 2022.

(51) Int. Cl.

*G05D 11/02* (2006.01)
*G05D 11/13* (2006.01)
*H10P 72/00* (2026.01)

(52) U.S. Cl.
CPC ........ *G05D 11/138* (2013.01); *H10P 72/0466* (2026.01)

(58) Field of Classification Search
CPC .......................... H01L 21/67253; G05D 11/02
See application file for complete search history.

(56) References Cited

U.S. PATENT DOCUMENTS 10,566,216 B2 2/2020 Senn et al.
10,903,065 B2 1/2021 Taylor et al.
(Continued)

FOREIGN PATENT DOCUMENTS

TW 201939649 A 10/2019

OTHER PUBLICATIONS

International Search Report and Written Opinion of the ISA issued in PCT/US2022/052684, mailed Apr. 24, 2023; ISA/KR.
(Continued)

*Primary Examiner* — Paul J Gray

(57) ABSTRACT

A composition mixture control system for an equipment front end module includes a manifold, flow controllers and a composition controller. The flow controllers are configured to control flow of respective gases to the manifold, where the manifold is configured to mix the gases received from the flow controllers and direct a resultant gas mixture to an enclosure in the equipment front end module. The composition controller is configured to control operation of the flow controllers to adjust a composition in the enclosure to a set target composition including the gases.

40 Claims, 8 Drawing Sheets

(56) References Cited

U.S. PATENT DOCUMENTS

| | | | |
|---|---|---|---|
| 2002/0042205 | A1 | 4/2002 | McMillin et al. |
| 2004/0259370 | A1 | 12/2004 | Bergman |
| 2018/0358239 | A1 | 12/2018 | Senn et al. |
| 2019/0310002 | A1* | 10/2019 | Matsuura ............ C23C 16/4586 |
| 2021/0013078 | A1 | 1/2021 | Kawai et al. |
| 2021/0366735 | A1 | 11/2021 | Barros et al. |
| 2021/0375592 | A1 | 12/2021 | Moyama et al. |

OTHER PUBLICATIONS

Office Action issued in corresponding Taiwanese Patent Application No. 111148857 dated Mar. 22, 2026.

* cited by examiner

COMPOSITION MIXTURE CONTROL OF EFEM ENVIRONMENT

CROSS-REFERENCE TO RELATED APPLICATIONS

This application is a U.S. National Phase Application under 35 U.S.C. 371 of International Application No. PCT/US2022/052684, filed on Dec. 13, 2022, which claims the benefit of U.S. Provisional Application No. 63/297,360, filed on Jan. 7, 2022. The entire disclosures of the applications referenced above are incorporated herein by reference.

FIELD

The present disclosure relates to environments within equipment front end modules.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to perform deposition, etch and/or other treatments of substrates such as semiconductor wafers. During processing, a substrate is arranged on a substrate support in a processing chamber of the substrate processing system. Gas mixtures including one or more precursors may be introduced into the processing chamber and plasma may be struck to activate chemical reactions.

The substrate processing system may include substrate processing tools arranged within a fabrication room. Each of the substrate processing tools may include multiple process modules including respective processing chambers. Each of the substrate processing modules may perform a clean, deposition or etch process. Substrates are transferred into a substrate processing tool through one or more intermediate chambers, such as front opening unified pods (FOUPs), an equipment front end module (EFEM), and/or load locks. The EFEM may be used to transport substrates between a storage container, such as the FOUP, and another portion of the substrate processing tool. For example, the substrates may be transferred between an EFEM and process modules via a vacuum transfer module (VTM).

SUMMARY

According to certain embodiments, the present disclosure discloses a composition mixture control system for an equipment front end module. The composition mixture control system includes: a manifold; flow controllers configured to control flow of respective gases to the manifold, where the manifold is configured to mix the gases received from the flow controllers and direct a resultant gas mixture to an enclosure in the equipment front end module; and a composition controller configured to control operation of the flow controllers to adjust a composition in the enclosure to a set target composition including the gases.

In some embodiments, the flow controllers include gas mass flow controllers configured to receive respective gases from multiple gas sources.

In some embodiments, the flow controllers include an air flow controller configured to control flow of ambient air to the manifold. In some embodiments, the composition mixture control system further includes a valve. The composition controller is configured to control a state of the valve to draw ambient air into the enclosure to mix with the resultant gas mixture. In some embodiments, the composition mixture control system further includes at least one of a fan and an exhaust valve. The composition controller is configured to control state of the at least one of the fan and the exhaust valve to reduce pressure in the enclosure and draw the ambient air into the enclosure.

In some embodiments, the composition mixture control system further includes an exhaust valve controlling flow of gases out of the enclosure. The composition controller is configured to selectively set an opening state of the exhaust valve to adjust at least one of a pressure within the enclosure and a composition in the enclosure to the set target composition.

In some embodiments, the composition mixture control system further includes: a vaporizer configured to vaporize a liquid and supply a resulting vapor to the manifold; and a liquid flow controller configured to control flow of the liquid from a liquid source to the vaporizer.

In some embodiments, the flow controllers include a gas mass flow controller configured to supply a gas to the vaporizer. In some embodiments, the liquid includes water. In some embodiments, the flow controllers include: a first gas mass flow controller configured to control flow of a first gas to the manifold; a second gas mass flow controller configured to control flow of a second gas to the manifold; and the second gas is different than the first gas.

In some embodiments, the gases include a first gas and a second gas. The first gas includes at least one of nitrogen, carbon dioxide and argon. The second gas includes at least one of extreme clean dry air and dehumidified air.

In some embodiments, the flow controllers include: a first gas mass flow controller configured to control flow of a first gas to the manifold; a second gas mass flow controller configured to control flow of a second gas to the manifold; and the second gas is different than the first gas.

In some embodiments, the composition mixture control system further includes sensors configured to monitor parameters related to the composition in at least one of the enclosure and a recirculation duct. The composition controller is configured to control operation of the flow controllers based on the monitored parameters to adjust flow of the gases to the manifold.

In some embodiments, the monitored parameters include constituent levels of the gases.

In some embodiments, the monitored parameters include an oxygen level and a relative humidity level in at least one of the enclosure and a recirculation duct recirculating gases from an output of the equipment front end module to an input of the equipment front end module.

In some embodiments, the composition controller is configured to at least one of: control operation of the flow controllers independent of the monitored parameters; and at least one of permit transfer of a substrate through the enclosure and perform a countermeasure based on the monitored parameters.

In some embodiments, the composition mixture control system further includes sensors configured to monitor parameters directly related to at least one of the composition in the enclosure and a composition in a recirculation duct. The composition controller is configured to, while operating in an open loop mode: control operation of the flow controllers independent of the monitored parameters; and at least one of permit transfer of a substrate through the enclosure and perform a countermeasure based on the monitored parameters.

In some embodiments, the composition mixture control system further includes: the enclosure; a fan filter module connected to the enclosure; and a recirculation duct configured to recirculate gases output from the equipment front end module to the fan filter module. The fan filter module is configured to filter gases received from the manifold prior to the gases being received in the enclosure.

In some embodiments, the composition mixture control system further includes: the enclosure; and a fan filter module connected to the enclosure and configured to filter gases received from the manifold prior to the gases being received in the enclosure. The manifold is connected to the fan filter module and configured to receive gases from the flow controllers, mix the gases and supplied a mixture of the gases to the fan filter module. In some embodiments, the composition mixture control system further includes a recirculation duct configured to recirculate gases output from the equipment front end module to the manifold.

In some embodiments, the composition mixture control system further includes sensors attached to at least one of the enclosure and the recirculation duct. The composition controller configured to control operation of the flow controllers based on outputs of the sensors.

In some embodiments, the composition mixture control system further a temperature sensor configured to detect a temperature within the enclosure or in a recirculation duct. The composition controller is configured to control the flow controllers to limit a moisture level of the composition in the enclosure to prevent condensation in the enclosure.

In some embodiments, a composition control method is disclosed and includes: controlling flow of gases to a manifold via flow controllers; mixing the gases in the manifold to provide a resultant gas mixture; supplying the resultant gas mixture to an enclosure in an equipment front end module; and controlling operation of the flow controllers to adjust a composition in the enclosure to a set target composition including the gases.

In some embodiments, the composition control method further includes: monitoring constituent levels of gases in the composition in the enclosure; and based on the constituent levels, adjusting operation of the flow controllers to provide the set target composition in the enclosure.

In some embodiments, the composition control method further includes: monitoring an oxygen level and a relative humidity level in the enclosure; and based on the oxygen level and the relative humidity level, adjusting operation of the flow controllers to provide the set target composition in the enclosure.

In some embodiments, the composition control method further includes: recirculating gases from an output of the enclosure to an input of the enclosure via a recirculation duct; monitoring constituent levels of gases in the recirculation duct; and based on the constituent levels, adjusting operation of the flow controllers to provide the set target composition in the enclosure.

In some embodiments, the composition control method further includes: recirculating gases from an output of the enclosure to an input of the enclosure via a recirculation duct; monitoring an oxygen level and a relative humidity level in the recirculation duct; and based on the oxygen level and the relative humidity level, adjusting operation of the flow controllers to provide the set target composition in the enclosure.

In some embodiments, the composition control method further includes selectively setting an opening state of an exhaust valve of the enclosure to adjust at least one of a pressure within the enclosure and a composition in the enclosure to the set target composition.

In some embodiments, the composition control method further includes: vaporizing via a vaporizer a liquid and supplying a resulting vapor to the manifold; and controlling flow of the liquid from a liquid source to the vaporizer to adjust a composition in the enclosure to the set target composition. In some embodiments, the liquid includes water.

In some embodiments, the composition control method further includes supplying a gas to the vaporizer via one of the flow controllers, where the one of the flow controllers is a gas mass flow controller.

In some embodiments, the composition control method further includes: controlling flow of a first gas to the manifold via a first one of the flow controllers; controlling flow of a second gas to the manifold via a second one of the flow controllers; and the second gas is different than the first gas.

In some embodiments, the gases include a first gas and a second gas; the first gas includes at least one of nitrogen, carbon dioxide and argon; and the second gas includes at least one of extreme clean dry air and dehumidified air.

In some embodiments, the composition control method further includes: controlling flow of a first gas to the manifold via a first one of the flow controllers; controlling flow of a second gas to the manifold via a second one of the flow controllers; and the second gas is different than the first gas.

In some embodiments, the composition control method further includes: monitoring parameters related to the composition in at least one of the enclosure and a recirculation duct; and controlling operation of the flow controllers based on the monitored parameters to adjust flow of the gases to the manifold.

In some embodiments, the monitored parameters include constituent levels of the gases.

In some embodiments, the monitored parameters include an oxygen level and a relative humidity level in at least one of the enclosure and the recirculation duct recirculating gases from an output of the equipment front end module to an input of the equipment front end module.

In some embodiments, the composition control method further includes: recirculating gases from an output of the enclosure to an input of the enclosure via a recirculation duct; monitoring an oxygen level and a relative humidity level in the recirculation duct; and based on the oxygen level and the relative humidity level, adjusting operation of the flow controllers to provide the set target composition in the enclosure. In some embodiments, the composition control method further includes selectively setting an opening state of an exhaust valve of the enclosure to adjust at least one of a pressure within the enclosure and a composition in the enclosure to the set target composition.

In some embodiments, the composition control method further includes at least one of: controlling operation of the flow controllers independent of the monitored parameters; and at least one of permit transfer of a substrate through the enclosure and perform a countermeasure based on the monitored parameters.

In some embodiments, the composition control method further includes: monitoring parameters directly related to at least one of the composition in the enclosure and a composition in a recirculation duct; and while operating in an open loop mode, controlling operation of the flow controllers independent of the monitored parameters, and at least one of permitting transfer of a substrate through the enclosure and performing a countermeasure based on the monitored parameters.

In some embodiments, the composition control method further includes: detecting a temperature within the enclosure or in a recirculation duct; and controlling the flow controllers to limit a moisture level of the composition in the enclosure to prevent condensation in the enclosure.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 2:
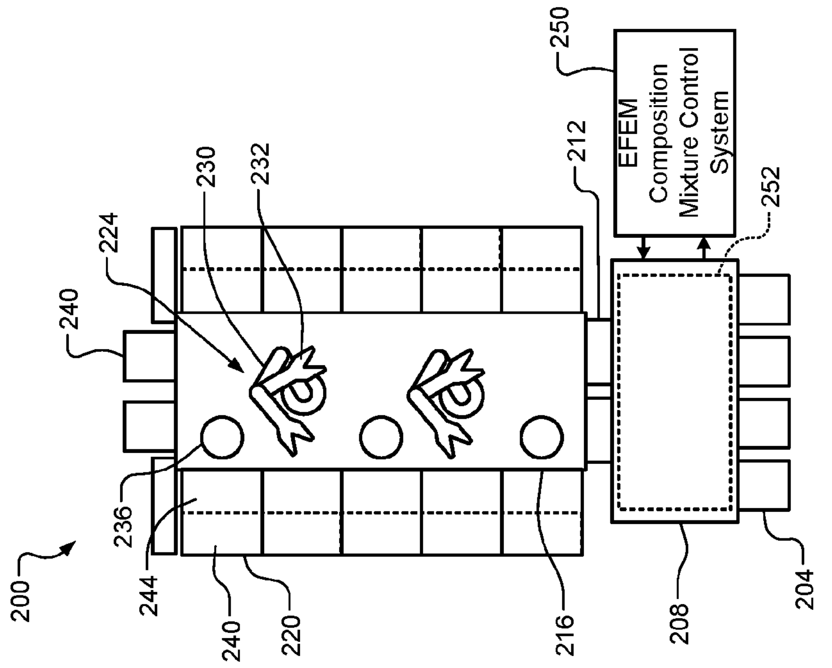
FIG. 2 is a plan view of another example substrate processing tool including an EFEM composition mixture control system in accordance with the present disclosure.

An EFEM may include a sealed enclosure (referred to as the EFEM enclosure) and a robot disposed in the EFEM enclosure for transfer of substrates between, for example, FOUPs and one or more load locks. The examples disclosed herein include sealed EFEM enclosures. The EFEM enclosure typically has a top-mounted fan filter unit (FFU) that is used to flow filtered gas through the EFEM enclosure to maintain a clean environment within the EFEM enclosure. The filtered gas may include, for example, nitrogen gas. The nitrogen gas is used as a purge gas to displace ambient air (or fabrication room air) from within the EFEM enclosure. This is performed until a composition within the EFEM enclosure approaches a composition of the purge gas.

To prevent and/or minimize leaks into the EFEM enclosure, the EFEM enclosure is mechanically sealed and pressure within the EFEM enclosure is regulated to maintain a positive pressure within the EFEM enclosure. Although an EFEM enclosure may be purged using a purge gas, due to permeation and/or leak-by of seals, seams, and/or cracks, ambient air may enter the EFEM enclosure. This permeation and/or leak-by of ambient air results in a small (or negligible) amount of gas within the EFEM that may include, for example, oxygen and water vapor. Purging and maintaining a positive pressure within the EFEM enclosure, results in a low percentage by volume of oxygen and water content within the EFEM enclosure. Providing an internal environment that has low percentages of oxygen and water content, minimizes oxidation and corrosion of substrate surfaces, minimizes process byproduct off-gassing both pre-processing and post-processing, and minimizes condensing of water onto substrate surfaces, which reduces substrate defects.

A completely inert environment within an EFEM enclosure may not provide an appropriate environmental condition to control substrate yield. The examples set forth herein include gas mixing systems for providing a controlled mixture of gases to an EFEM enclosure. In one example, the content levels of oxygen ($O_2$) and water ($H_2O$) are controlled to provide a controlled intermediate mixture level, where the percentage of $O_2$ in the EFEM enclosure is selectively set between 0-21% by volume and a relative humidity (RH) level in the EFEM enclosure is selectively set between 0-100%.

Intermediate mixture levels refer to mixtures that do not consist only of a single particular purge gas (e.g., nitrogen), but rather include multiple gases provided at controlled flow rates. The gases may include oxygen, nitrogen, water vapor and/or other gases, examples of which are provided below. The levels of the one or more gases may be set higher than would be associated with simply permeation and/or leak-by of ambient air. As an example, oxygen, ambient air, clean dry air, dehumidified air, and/or water vapor may be supplied in a controlled manner to provide increased selected levels of oxygen and/or moisture in an EFEM enclosure. Other examples are disclosed below. The contents of the EFEM enclosure are precisely set and maintained using open and/or closed loop feedback control.

Figure 1:
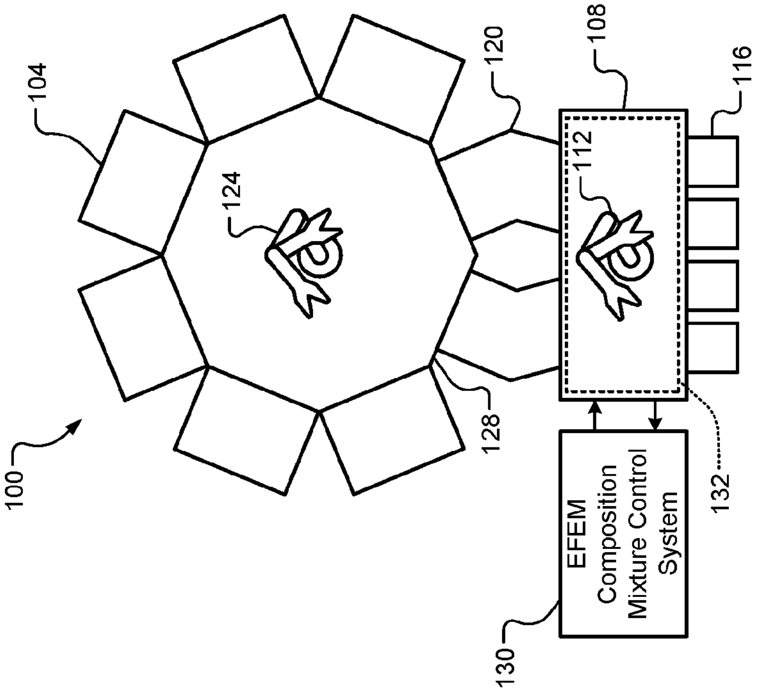
FIG. 1 is an example substrate processing tool including an EFEM composition mixture control system in accordance with the present disclosure.

The following FIGS. 1-2 show two example substrate processing tools including two example EFEMs. The examples disclosed herein are applicable to other substrate processing tools and EFEMs.

FIG. 1 shows a substrate processing tool 100 that includes processing modules (PMs) 104. For example only, each of the PMs 104 may be configured to perform one or more respective processes on a substrate. Substrates to be processed are loaded into the substrate processing tool 100 via ports of a loading station of an atmosphere-to-vacuum (ATV) transfer module, such as an EFEM 108, and then transferred into one or more of the PMs 104. For example, a transfer robot 112 is arranged to transfer substrates from loading stations 116 to airlocks, or load locks, 120, and a robot 124 of a vacuum transfer module 128 is arranged to transfer substrates from the load locks 120 to the various PMs 104. In the example shown in FIG. 1, the substrate processing tool 100 has a circular arrangement. Accordingly, the PMs 104 are arranged azimuthally around the vacuum transfer module (VTM) 128. A fabrication room may include several of the substrate processing tools 100.

The substrate processing tool 100 further includes an EFEM composition mixture control system 130 that controls a composition of contents within an enclosure 132 of the EFEM 108. The contents including two or more gases supplied to the EFEM enclosure 132. The EFEM composition mixture control system 130 may control and adjust flow of the gases to the EFEM enclosure 132. The EFEM composition mixture control system 130 may be configured and operated similarly as the EFEM composition mixture control systems of FIGS. 3-5.

FIG. 2 shows another example substrate processing tool 200 that includes loading stations 204, EFEM 208, load locks 212, and a VTM 216 arranged in a linear configuration. For example, the loading stations 204 may be implemented as FOUPs. In some examples, the load locks 212 may be fully or partially integrated within the EFEM 208. In other examples, the load locks 212 are arranged outside of and adjacent to the EFEM 208.

The tool 200 includes PMs 220 in a linear arrangement in two parallel rows adjacent to and offset from the VTM 216. The PMs 220 may include substrate processing chambers configured to perform etch, deposition, clean or other treatment operations on substrates. The etching may include dielectric etching (e.g., inductively coupled plasma (ICP) etching) or capacitive etching (e.g., capacitively coupled plasma (CCP) etching).

The VTM 216 may include one or more robots 224 having various configurations. Although shown having one arm 230, each of the robots 224 may have configurations including one, two, or more of the arms 230. In some examples, the robots 224 may include one or two end effectors 232 on each of the arms 230.

The substrate processing tool 200 may include one or more storage buffers 236. The storage buffers 236 are configured to store one or more substrates between processing stages, before or after processing, etc., and/or to store edge rings, covers, and other components of the PMs 220. In other examples, one or more of the storage buffers 236, additional process modules, post-processing modules, and/or other components may be arranged on the end of the VTM 216 opposite the loading stations 204. In some examples, one or more of the EFEM 208, the load locks 212, the VTM 216, and the PMs 220 may have a vertically stacked configuration.

Each of the PMs 220 includes associated internal and external components (not shown) including, but not limited to, radio frequency (RF) generator and power supply circuitry and gas delivery system components. For example, each of the process modules 220 includes an RF generator 240 and a gas box 244 (e.g., including components such as one or more manifolds, valves, flow controllers, etc.). In the substrate processing tool 200 according to the present disclosure, the RF generator 240 and the gas box 244 are arranged above the PM 220. The RF generators 240 and the gas boxes 244 are arranged side-by-side above the process modules 220. The RF generators and gas boxes may be disposed in other arrangements.

The substrate processing tool 200 further includes an EFEM composition mixture control system 250 that controls a composition of contents within an enclosure 252 of the EFEM 208. The contents including two or more gases supplied to the EFEM enclosure 252. The EFEM composition mixture control system 250 may control and adjust flow of the gases to the EFEM enclosure 252. The EFEM composition mixture control system 250 may be configured and operated similarly as the EFEM composition mixture control systems of FIGS. 3-5.

Figure 3:
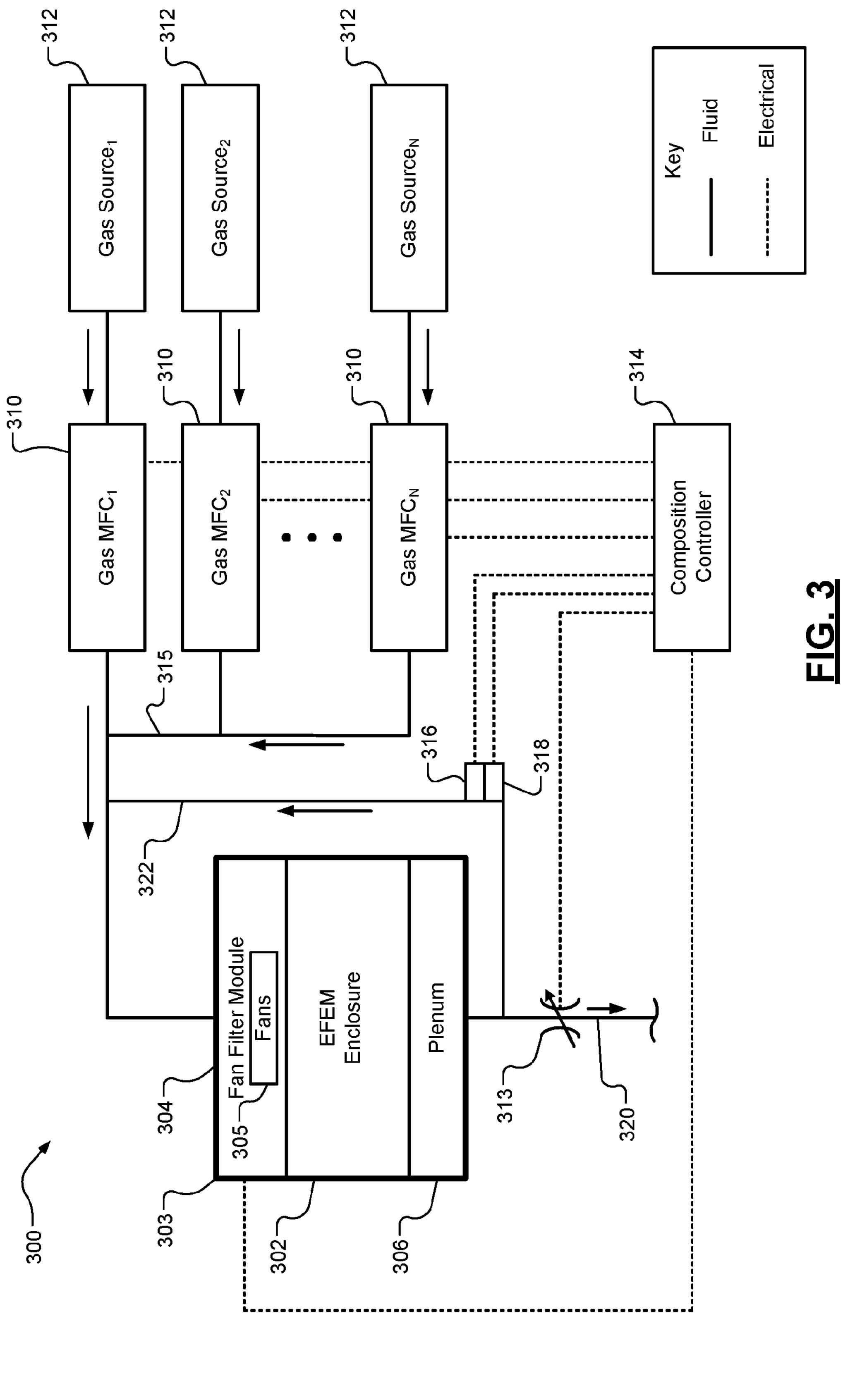
FIG. 3 is a functional block diagram of an EFEM composition mixture control system including multiple gas sources in accordance with the present disclosure.

FIG. 3 shows an EFEM composition mixture control system 300 for an EFEM enclosure 302. An EFEM 303 is shown and includes the EFEM enclosure 302, a fan filter module 304 and a plenum 306. The fan filter module 304 filters gases received prior to being provided into the EFEM enclosure 302. The fan filter module 304 also filters air and/or gases recirculating through the EFEM 303. The fan filter module 304 may include one or more fans 305 for moving gases into the EFEM enclosure 302. The one or more fans 305 provide laminar airflow through the EFEM enclosure 302. Purge gases may be moved into the EFEM enclosure 302 as a result of pressures of the corresponding gas sources. The plenum 306 collects gases within the EFEM enclosure 302 and is used for controlling uniformity of air flow in the EFEM enclosure 302.

The EFEM composition mixture control system 300 includes (i) multiple mass flow controllers (MFCs) 310 that receive gases from respective gas sources 312, and (ii) an exhaust valve 313. The MFCs 310 control flow of gases from the gas sources 312 to a manifold 315. A composition controller 314 is connected to and, based on outputs from sensors (e.g., two example sensors 316, 318 are shown), (i) controls operation of (i) the gas MFCs 310, and (ii) may control operation of the fan filter module 304 and/or the exhaust valve 313. The fan filter module 304 may include a controller that independently controls operation of the one or more fans 305 of the fan filter module 304 and/or the composition controller 314 may control operation of the one or more fans 305. Another controller may be included to independently control a state of the exhaust valve 313, which may be adjusted to control pressure within the EFEM enclosure 302. The exhaust valve 313 is a variable control valve (also referred to as a throttle valve) that is used to control the EFEM pressure by offsetting a rate of input purge and may also be used to control a rate of recirculation of air back to the EFEM enclosure 302. The opening state of the exhaust valve 313 is directly related to a flow rate of air output from the plenum 306 and exhausted via an exhaust duct 320. The exhaust valve 313 is set to control pressure during a purge from gas sources to balance volume flow of gases into the EFEM enclosure 302. Exhausting some intermediate concentration of gas may occur during this purge.

A flow rate of air output from the plenum 306 and recirculated back to the fan filter module 304 via a recirculation duct 322 may be controlled by controlling operation of the one or more fans 305 of the fan filter module 304. The recirculation duct 322 recirculates air received from the plenum 306 back to the fan filter module 304.

The manifold 315 mixes gases received from the gas MFCs 310 and supplies a resultant gas mixture to the recirculation duct 322, which supplies the gas mixture to the fan filter module 304. In some embodiments, the manifold 315 is directly connected to the input of the fan filter module 304 and supplies gases directly to the input of the fan filter module 304. The manifold 315 is configured to mix the gases received from the MFCs 310 and direct the resultant gas mixture to the enclosure 302 in the EFEM 303. In some embodiments, the mixing is performed by the fan filter module 304.

The EFEM composition mixture control system 300 may include two or more gas MFCs 310 and two or more gas sources 312. The gas sources 312 may each include one or more gases, such as nitrogen ($N_2$), oxygen ($O_2$), carbon dioxide ($CO_2$), argon (Ar), ultra clean dry air, dehumidified air, etc. The gases may be referred to as purge gases. The gas sources 312 may include pressurized gas and/or gas stored in a gas reservoir. The gas sources 312 may include blowers, fans, compressors, pressurized tanks, dehumidifiers, etc.

The composition controller 314 controls operation of the gas MFCs 310 to provide a target composition in the EFEM enclosure 302. In one embodiment, the gas MFCs 310 and the exhaust valve 313 are controlled, such that a relative humidity level within the EFEM enclosure 302 is adjusted to be between 0-100% and an $O_2$ percentage by volume of air within the EFEM enclosure 302 is 0-21% (or 0 to a percentage of $O_2$ in ambient air). This control may include monitoring states of one or more sensors (e.g., the sensors 316, 318), and based on outputs of the sensors adjusting outputs of the gas MFCs 310. Although the sensors 316, 318 are shown attached to the recirculation duct 322, the sensors 316, 318 and/or other sensors may be attached to the recirculation duct 322 and/or the EFEM enclosure 302. The sensors generate signals that are indicative of states of environments within the recirculation duct 322 and within the EFEM enclosure 302. A state of the environment within the EFEM enclosure 302 may be estimated indirectly by determining the environmental state within the recirculation duct 322. The state of the environments within the EFEM enclosure 302 and the recirculation duct 322 refers to the compositions within the EFEM enclosure 302 and the recirculation duct 322.

The sensors may include gas sensors, humidity sensors, and temperature sensors. The gas sensors may be configured to detect levels of respective gases, such as levels of $N_2$, $O_2$, $CO_2$, etc. Each humidity sensor may include an air sensor, a water sensor and a temperature sensor. The humidity sensors are used to detect levels of moisture in the recirculation duct 322 and in the EFEM enclosure 302. In one embodiment, a sensor detects a dew-point of water in air, which is a mass fraction, and also measures temperature to output a relative humidity value. The sensors may include a chromatography system for separating components of a mixture in order to detect gases of a mixture and corresponding percentages thereof. The sensors may include a residual gas analyzer (RGA) that samples a gas mixture within the EFEM enclosure 302 and/or the recirculation duct 322 and determines the elements of the gas mixture and the ratios of the elements (or gases). The RGA may determine gas molecules by volume and/or atomic gas units of the gas mixture. The RGA may include a mass spectrometer and one or more pressure sensors, such as manometers, for measuring gas pressures. The RGA may be used to measure traces of impurities. The RGA may measure pressure by sensing weight of each atom as it passes through a quadrupole. The sensors may include a heated zirconia oxygen sensor.

Temperatures in an EFEM enclosure and/or a recirculation duct may be monitored and supplied gas flow rates may be adjusted based thereon, in any of the embodiments disclosed herein, to prevent a concentration set point that results in a dew-point transition and condensation. For example, the composition controller 314 is configured to control the gas MFCs 310 to limit a moisture level of the composition in the EFEM enclosure 302 to prevent condensation in the EFEM enclosure 302. The composition controller 314 may limit a moisture set point of the EFEM enclosure 302 to prevent a dew-point set point that results in condensation in the EFEM 303 and/or the recirculation duct 322. This control may be based on the detected temperatures and is also applicable to the examples of FIGS. 4-5 and 7.

The composition controller 314 may implement proportional control and/or a proportional-integral-differential (PID) loop to adjust states of the gas MFCs 310 and the exhaust valve 313. In one embodiment, the composition controller 314 sets states of the gas MFCs 310 and the exhaust valve 313 based on one or more look-up tables (LUTs) relating sensor outputs to gas MFC control values. The composition controller 314 sets states of the gas MFCs 310 and the exhaust valve 313 based on a target composition having associated ratios of the gases supplied by the gas MFCs 310.

In one embodiment, the gases from the manifold 315 and the recirculation duct 322 are directed to the EFEM enclosure 302 directly without passing through the FFM 304. In this example embodiment, the FFM 304 may not be included or may be bypassed. When the FFM 304 is not included or bypassed, the manifold 315 and the recirculation duct 322 may include respective filters for filtering the gases supplied to the EFEM enclosure. A fan and/or one-way valve may be connected in the recirculation duct 322 and/or a path thereof to direct gas from the outlet of the EFEM 303 to the input of the EFEM enclosure 302.

Figure 4:
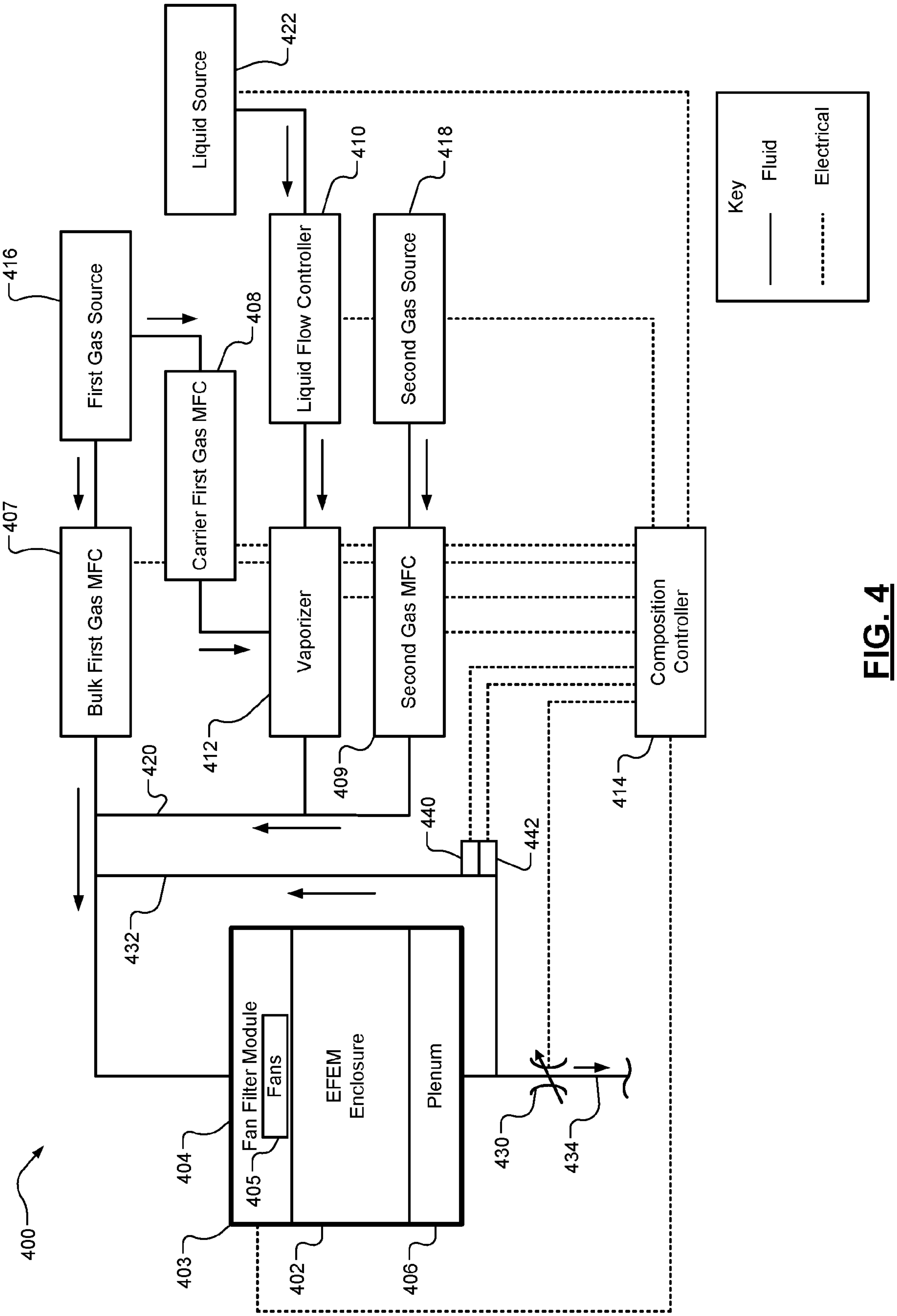
FIG. 4 is a functional block diagram of an EFEM composition mixture control system including multiple gas sources, a liquid source and a vaporizer in accordance with the present disclosure.

FIG. 4 shows an EFEM composition mixture control system 400 for an EFEM enclosure 402. An EFEM 403 is shown and includes the EFEM enclosure 402, a fan filter module 404 and a plenum 406. The fan filter module 404 may include one or more fans 405 for moving gases into the EFEM enclosure 402. The fan filter module 404 also filters air and/or gases recirculating through the EFEM 403. The fan filter module 404 filters gases received prior to being provided into the EFEM enclosure 402. The one or more fans 405 provide laminar airflow through the EFEM enclosure 402. Purge gases may be moved into the EFEM enclosure 402 as a result of pressures of the corresponding gas sources. The plenum 406 collects gases within the EFEM enclosure 402 and is used for controlling uniformity of air flow in the EFEM enclosure 402.

The EFEM composition mixture control system 400 includes: one or more MFCs, such as a bulk first gas MFC 407, a carrier first gas MFC 408, and a second gas MFC 409; a liquid flow controller 410; a vaporizer 412; and a composition controller 414. The MFCs and liquid flow controllers referred to herein may be referred to as flow controllers. The MFCs 407-409 receive gases from corresponding gas sources 416, 418. Although two gas sources and three gas MFCs are shown, additional gas sources and gas MFCs may be included. The first gas source 416 feeds the first gas MFCs 407, 408. The bulk first gas MFC 407 transfers more gas than the carrier first gas MFC 408. The MFCs 407, 409 control flow of gases from the gas sources 416, 418 to a manifold 420.

The liquid flow controller 410 controls flow of liquid from a liquid source 422 to the vaporizer 412. The carrier first gas MFC 408 controls flow of gas (referred to as carrier gas) from the first gas source 416 to the vaporizer 412. In one embodiment, the liquid source 422 supplies water (e.g., deionized water (DIW)) to the liquid flow controller 410. The liquid source 422 may include a reservoir for storage of the water. The vaporizer 412 vaporizes a liquid out of the liquid flow controller 410, such that the liquid is converted to a vapor, which is supplied to the manifold 420. For this reason, the vaporizer 412 may be referred to as a gas source. The carrier gas is used to move the vapor into the manifold 420, where the vapor is then mixed with the gases output from the MFCs 407, 409 in the manifold 420. Inline mixing of gases allows for delivery of purge gas to the EFEM enclosure 402 with specific constituent levels. For example, inline mixing of $N_2$, ultra clean dry air, and vaporized DIW allows for delivery of purge gas to EFEM enclosure 402 with a specific $O_2$ and $H_2O$ content levels. In this context, the constituent levels and content levels may refer to the percentages of constituents (or elements) in a volume of gas being supplied to the EFEM enclosure 402. Constituent levels and content levels may also refer to percentages of the constituents in a composition of gases within an EFEM enclosure (e.g., the EFEM enclosure 402) or in a recirculation duct (e.g., the recirculation duct 432).

The composition controller 414 is connected to and, based on outputs from sensors (e.g., two example sensors 440, 442 are shown), (i) controls operation of the MFCs 407-409, the liquid flow controller 410, and the vaporizer 412, and (ii) may control operation of the fan filter module 404 and/or an exhaust valve 430. This control is implemented to provide a target composition of gases in the EFEM enclosure 402. The fan filter module 404 may include a controller that independently controls operation of the one or more fans 405 of the fan filter module 404 and/or the composition controller 414 may control operation of the one or more fans 405. Another controller may be included to independently control a state of the exhaust valve 413, which may be adjusted to control pressure within the EFEM enclosure 402. The exhaust valve 430 is a variable control valve that is used to control the EFEM pressure by offsetting a rate of input purge and may also control a rate of recirculation of air back to the EFEM enclosure 402. In some embodiments, the opening state of the exhaust valve 430 is directly related to a flow rate of air output from the plenum 406 and exhausted via an exhaust duct 434. The exhaust valve 430 is set to control pressure during a purge from gas sources to balance volume flow of gases into the EFEM enclosure 402. Exhausting some intermediate concentration of gas may occur during this purge.

A flow rate of air output from the plenum 406 and recirculated back to the fan filter module 404 via a recirculation duct 432 may be controlled by controlling operation of the one or more fans 405 of the fan filter module 404. The recirculation duct 432 recirculates air received from the plenum 406 back to the fan filter module 404.

The manifold 420 mixes gases received from the gas MFCs 407, 409 and the vaporizer 412 and supplies a resultant gas mixture to the recirculation duct 432, which supplies the gas mixture to the fan filter module 404. In some embodiments, the manifold 420 is directly connected to the input of the fan filter module 404 and supplies gases directly to the input of the fan filter module 404. In some embodiments, the mixing is performed by the fan filter module 404.

The gas sources 416, 418 may each include one or more gases, such as $N_2$, $O_2$, $CO_2$, Ar, ultra clean dry air, dehumidified air, etc. The gases may be referred to as purge gases. The gas sources 416, 418 may include pressurized gas and/or gas stored in a gas reservoir. The gas sources 416, 418 may include blowers, fans, compressors, pressurized tanks, dehumidifiers, etc.

In one embodiment, the first gas source 416 supplies $N_2$, the liquid source 422 supplies DIW, and the second gas source 418 supplies ultra clean dry air and/or dehumidified air. As an example, 0-2000 liters/minute (L/m) of gases may be supplied from the manifold 420 to the recirculation duct 432 to purge contents of the EFEM enclosure 402 and/or to maintain a target composition in the EFEM enclosure 402. In one embodiment, 0-1000 L/m are provided. As another example, 0-500 L/m of $N_2$ is delivered by the bulk first gas MFC 407, 0-3 grams/m of DIW is delivered by the vaporizer 412, and 0-500 L/m of ultra clean dry air or dehumidified air is delivered by the second gas MFC 409 to the manifold 420.

In one embodiment, the gas MFCs 407-409, the liquid flow controller 410, the vaporizer 412 and the exhaust valve 430 are controlled, such that a relative humidity level within the EFEM enclosure 402 is adjusted to be between 0-100% and an $O_2$ percentage by volume of air within the EFEM enclosure 402 is 0-21% (or 0 to a percentage of $O_2$ in ambient air). The composition controller 414 may determine and/or select these percentages based on sensed parameters output from sensors (e.g., the sensors 440, 442) and control operations of the gas MFCs 407-409, the liquid flow controller 410, the vaporizer 412 and the exhaust valve 430 accordingly. As a couple of examples, a relative humidity in the EFEM enclosure 402 may be 0-75% at 20° C. or 0-43% at 30° C.

The composition controller 414 monitors states of one or more sensors (e.g., the sensors 440, 442), and based on outputs of the sensors adjusts outputs of the gas MFCs 407-409, the liquid flow controller 410 and the vaporizer 412. Although the sensors 440, 442 are shown attached to the recirculation duct 432, the sensors 440, 442 and/or other sensors may be attached to the recirculation duct 432 and/or the EFEM enclosure 402. The sensors generate signals that are indicative of states of environments within the recirculation duct 432 and within the EFEM enclosure 402. The sensors may include any of the sensors disclosed above for the embodiment of FIG. 3.

The composition controller 414 may implement proportional control and/or a PID loop to adjust states of the gas MFCs 407-409, the liquid flow controller 410, the vaporizer 412 and/or the exhaust valve 430. In some embodiments, the exhaust valve is independently controlled by another controller. In one embodiment, the composition controller 414 sets states of the gas MFCs 407-409, the liquid flow controller 410, the vaporizer 412 and/or the exhaust valve 430 based on one or more LUTs relating sensor outputs to control values. The composition controller 414 sets states of the gas MFCs 407-409, the liquid flow controller 410, the vaporizer 412 and/or the exhaust valve 430 based on a target composition having associated ratios of the gases supplied. Moisture and oxygen levels within the EFEM enclosure 402 are able to be independently controlled by a three component recipe of, for example, $N_2$, water vapor, and ultra clean dry air (or dehumidified air).

In one embodiment, the gases from the manifold 420 and the recirculation duct 432 are directed to the EFEM enclosure 402 directly without passing through the FFM 404. In this example embodiment, the FFM 404 may not be included or may be bypassed. When the FFM 404 is not included or bypassed, the manifold 420 and the recirculation duct 432 may include respective filters for filtering the gases supplied to the EFEM enclosure. A fan and/or one-way valve may be connected in the recirculation duct 432 and/or a path thereof to direct gas from the outlet of the EFEM 403 to the input of the EFEM enclosure 402.

Figure 5:
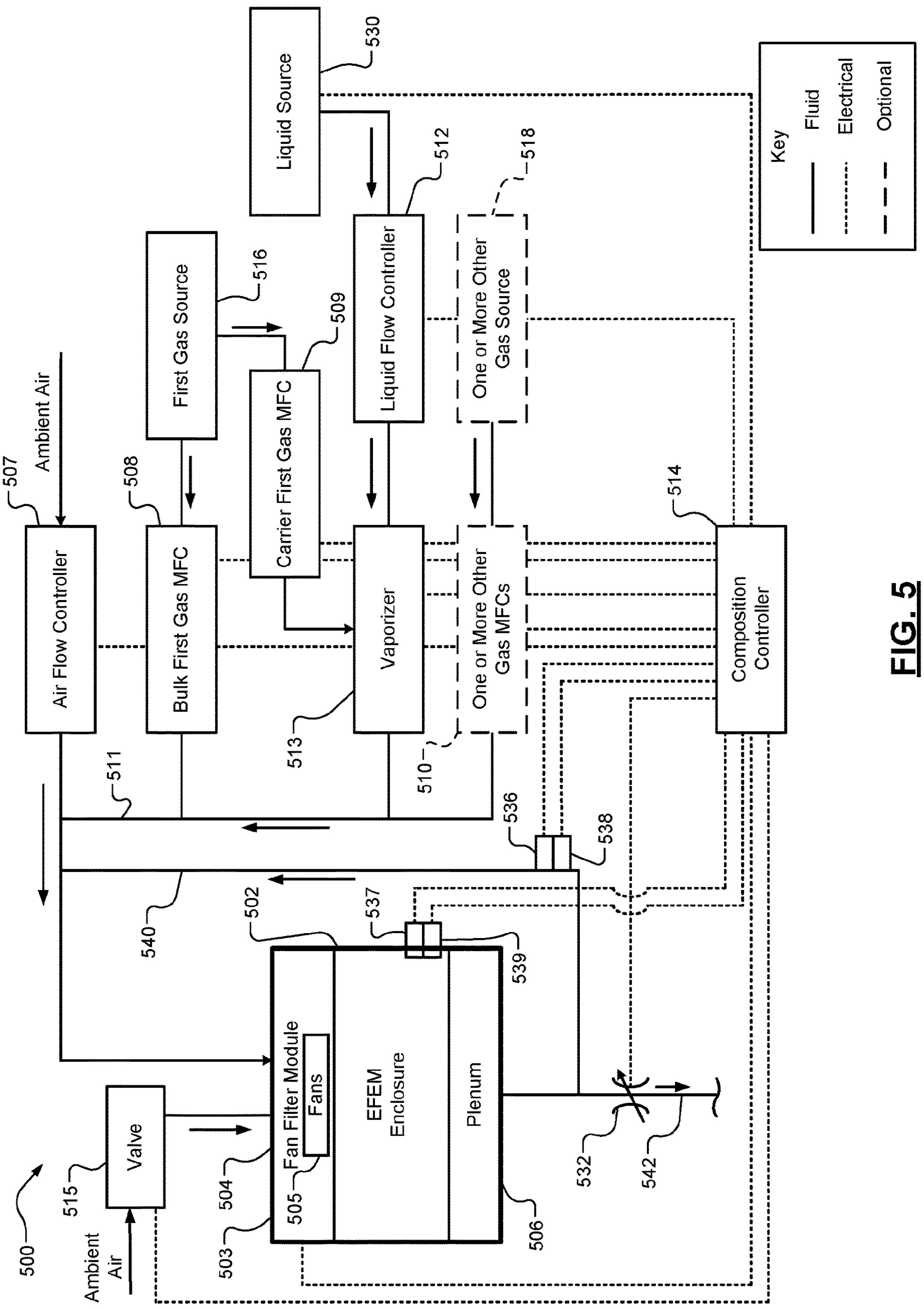
FIG. 5 is a functional block diagram of an EFEM composition mixture control system including an ambient air flow source and other fluid sources in accordance with the present disclosure.

FIG. 5 shows an EFEM composition mixture control system 500 for an EFEM enclosure 502. An EFEM 503 is shown and includes the EFEM enclosure 502, a fan filter module 504 and a plenum 506. The fan filter module 504 filters gases received prior to being provided into the EFEM enclosure 502. The fan filter module 504 also filters air and/or gases recirculating through the EFEM 503. The fan filter module 504 may include one or more fans 505 for moving gases into the EFEM enclosure 502. The one or more fans 505 provide laminar airflow through the EFEM enclosure 502. Purge gases may be moved into the EFEM enclosure 502 as a result of pressures of the corresponding gas sources. The plenum 506 collects gases within the EFEM enclosure 502 and is used for controlling uniformity of air flow in the EFEM enclosure 502.

Figure 6:
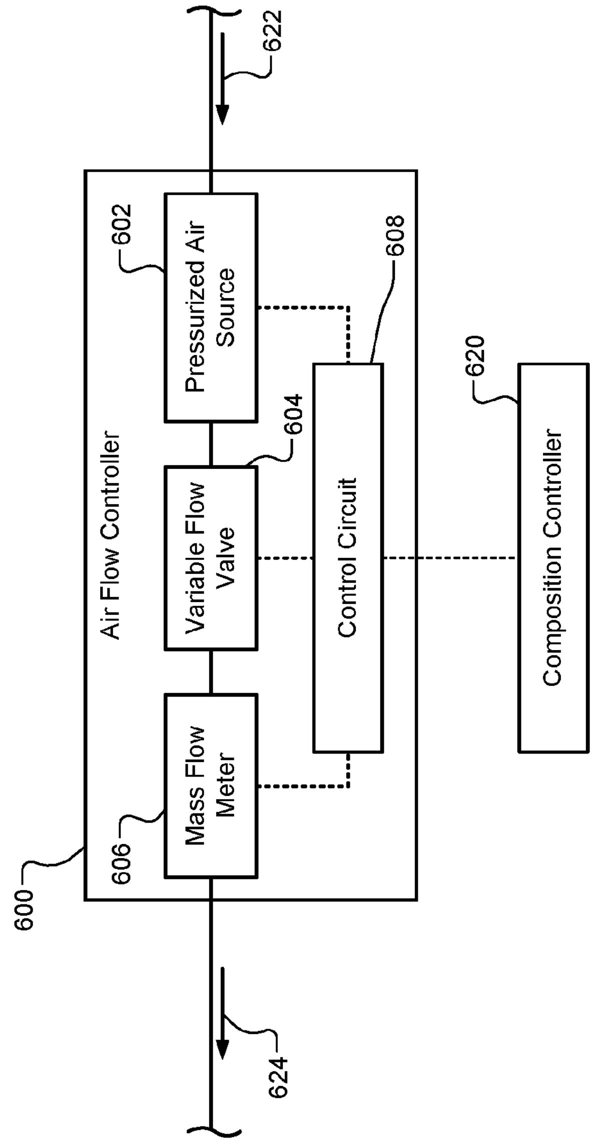
FIG. 6 is a functional block diagram of the air flow controller of FIG. 5.

The EFEM composition mixture control system 500 includes an air flow controller 507 and one or more MFCs, such as a bulk first gas MFC 508, a carrier first gas MFC 509 and optionally one or more other gas MFCs 510. The air flow controller 507 controls flow of ambient air into a manifold 511 and thus into the EFEM enclosure 502. An example of the air flow controller 507 is shown in FIG. 6. Ambient air may also be introduced into the EFEM enclosure 502 via a valve 515. The composition controller 514 may control the state of the valve 515. The valve 515 may be a fixed or variable state valve. A fixed valve refers to a valve having a fixed valve orifice size when in an open state. A fixed valve transitions between an open state and a closed state. A variable state valve is a valve that has multiple different open states with varying degrees of being open. In an embodiment, pressure at inlet of the fan filter module 504 is reduced to provide a low and/or negative pressure region to draw ambient air from the valve 515. Average pressure in the fan filter module 504 and/or EFEM enclosure 502 may be positive while a local area of the fan filter module 504 and/or EFEM enclosure 502 where air is drawn from may be negative (i.e., inlet and/or injection point of the fan filter module 504 and/or EFEM enclosure 502). The composition controller 514 controls the states of the valve 515, the fans 505 and the exhaust valve 532 and reduces the pressure at inlet of the fan filter module 504 to a negative gauge pressure.

The EFEM composition mixture control system 500 may further include a liquid flow controller 512, a vaporizer 513, and a composition controller 514. The MFCs 508-510 receive gases from corresponding gas sources 516, 518. The first gas source 516 feeds the first gas MFCs 508, 509. The bulk first gas MFC 508 transfers more gas than the carrier first gas MFC 509. The MFCs 508, 509 control flow of gases from the gas sources 516, 518 to a manifold 511.

In some embodiments, ambient air provides moisture and for this reason, the liquid flow controller 512, the vaporizer 513, and the liquid source 530 are not included. In other embodiments, for example, when high humidity levels are required, the liquid flow controller 512, the vaporizer 513 and the liquid source 530 are included as shown. The liquid flow controller 512 controls flow of liquid from a liquid source 530 to the vaporizer 513. The carrier first gas MFC 509 controls flow of gas (referred to as carrier gas) from the first gas source 516 to the vaporizer 513. When the vaporizer 513 is not included, the carrier first gas MFC 509 may also not be included. In one embodiment, the liquid source 530 supplies water (e.g., DIW) to the liquid flow controller 512. The liquid source 530 may include a reservoir for storage of the water. The vaporizer 513 vaporizes a liquid out of the liquid flow controller 512, such that the liquid is converted to a vapor, which is supplied to the manifold 511. The carrier gas is used to move the vapor into the manifold 511, where the vapor is then mixed with the gases output from the air flow controller 507 and the MFCs 508, 510.

The composition controller 514 is connected to and, based on outputs from sensors, (i) controls operation of the air flow controller 507, MFCs 508-510, the liquid flow controller 512, the vaporizer 513, the valve 515, and (ii) may control operation of the fan filter module 504 and/or an exhaust valve 532. This control is implemented to provide a target composition of gases in the EFEM enclosure 502. The fan filter module 504 may include a controller that independently controls operation of the one or more fans 505 of the fan filter module 504 and/or the composition controller 514 may control operation of the one or more fans 505. Another controller may be included to independently control a state of the exhaust valve 532, which may be adjusted to control pressure within the EFEM enclosure 502. Two example sensors 536, 538 are shown measuring parameters within the recirculation duct 540 and two other example sensors 537, 539 are shown measuring parameters within the EFEM enclosure 502. The exhaust valve 532 is a variable control valve that is used to control the EFEM pressure by offsetting a rate of input purge and may also control a rate of recirculation of air back to the EFEM enclosure 502. The opening state of the exhaust valve 532 is directly related to a flow rate of air output from the plenum 506 and exhausted via an exhaust duct 542. The exhaust valve 532 is set to control pressure during a purge from gas sources to balance volume flow of gases into the EFEM enclosure 502. Exhausting some intermediate concentration of gas may occur during this purge.

A flow rate of air output from the plenum 506 and recirculated back to the fan filter module 504 via a recirculation duct 540 may be controlled by controlling operation of the one or more fans 505 of the fan filter module 504. The recirculation duct 540 recirculates air received from the plenum 506 back to the fan filter module 504.

The manifold 511 mixes gases received from the air flow controller 507, the gas MFCs 508, 510 and the vaporizer 513 and supplies a resultant gas mixture to the recirculation duct 540, which supplies the gas mixture to the fan filter module 504. In some embodiments, the manifold 511 is directly connected to the input of the fan filter module 504 and supplies gases directly to the input of the fan filter module 504. In some embodiments, the mixing is performed by the fan filter module 504.

The gas sources 516, 518 may each include one or more gases, such as $N_2$, $O_2$, $CO_2$, Ar, ultra clean dry air, dehumidified air, etc. The gases may be referred to as purge gases. The gas sources 516, 518 may include pressurized gas and/or gas stored in a gas reservoir. The gas sources 516, 518 may include blowers, fans, compressors, pressurized tanks, dehumidifiers, etc.

In one embodiment, the air flow controller 507 and/or the valve 515 is controlled to supply ambient air, the first gas source 516 supplies $N_2$, the liquid source 530 supplies DIW, and the one or more other gas MFCs 510 are not included and/or utilized. In one embodiment, air flow controller 507, the gas MFCs 508-510, the liquid flow controller 512, the vaporizer 513, the valve 515, the exhaust valve 532 and optionally the one or more other gas MFCs 510 are controlled, such that a relative humidity level within the EFEM enclosure 502 is adjusted to be between 0-100% and an $O_2$ percentage by volume of air within the EFEM enclosure 502 is 0-21% (or 0 to a percentage of $O_2$ in ambient air). The composition controller 514 may determine and/or select these percentages based on sensed parameters output from sensors (e.g., sensors 536-539) and control operations of the air flow controller 507, the gas MFCs 508-510, the liquid flow controller 512, the vaporizer 513, the valve 515, and the exhaust valve 532 accordingly. As a couple of examples, a relative humidity in the EFEM enclosure 502 may be 0-75% at 20° C. or 0-43% at 30° C.

The composition controller 514 monitors states of one or more sensors (e.g., the sensors 536-539), and based on outputs of the sensors adjusts outputs of the air flow controller 507, the gas MFCs 508-510, the liquid flow controller 512, the vaporizer 513, and the valve 515. Although two sensors 536, 538 are shown attached to the recirculation duct 540 and two sensors 537, 539 are shown attached to the EFEM enclosure 502, the sensors 536-539 and/or other sensors may be attached to the recirculation duct 540 and/or the EFEM enclosure 502. The sensors generate signals that are indicative of states of environments within the recirculation duct 540 and the EFEM enclosure 502. The sensors may include any of the sensors disclosed above for the embodiment of FIG. 3.

The composition controller 514 may implement proportional control and/or a PID loop to adjust states of the air flow controller 507, gas MFCs 508-510, the liquid flow controller 512, the vaporizer 513, the valve 515 and the exhaust valve 532. In one embodiment, the composition controller 514 sets states of the air flow controller 507, gas MFCs 508-510, the liquid flow controller 512, the vaporizer 513, the valve 515 and the exhaust valve 532 based on one or more LUTs relating sensor outputs to control values. The composition controller 514 sets states of the air flow controller 507, gas MFCs 508-510, the liquid flow controller 512, the vaporizer 513, the valve 515 and the exhaust valve 532 based on a target composition having associated ratios of the gases supplied.

In one embodiment, the gases from the manifold 511 and the recirculation duct 540 are directed to the EFEM enclosure 502 directly without passing through the FFM 504. In this example embodiment, the FFM 504 may not be included or may be bypassed. When the FFM 504 is not included or bypassed, the manifold 511 and the recirculation duct 540 may include respective filters for filtering the gases supplied to the EFEM enclosure. A fan and/or one-way valve may be connected in the recirculation duct 540 and/or a path thereof to direct gas from the outlet of the EFEM 503 to the input of the EFEM enclosure 502.

FIG. 6 shows an air flow controller 600 that may be used in the examples of FIGS. 4-5. The air flow controller 600 may include a pressurized air source 602, a variable flow valve 604, a mass flow meter 606 and a control circuit 608. The control circuit 608 is connected to a composition controller 620, which may be configured and operate similarly as any of the composition controllers 314, 414, 514 of FIGS. 3-5. The pressurized air source 602 may include a fan, a compressor, a blower, etc. to provide pressurized air (or forced air) to the variable flow valve 604. The pressurized air source 602 may receive ambient air, referred to by arrow 622. In some embodiments the mass flow meter 606 is not included and the percentage open state of the variable flow valve 604 is controlled based on a look-up table. The air flow controller 600 may include other sensors, such as a flow speed sensor. The control circuit 608 may determine a volume flow rate based on the flow speed.

The variable flow valve (or variable conductance valve) 604 controls flow of air from the pressurized air source 602 to the mass flow meter 606 and/or out of the air flow controller 600. The mass flow meter 606 and/or the other sensors, such as the flow speed sensor, may be used for closed loop control and measures a mass flow rate of air out of the air flow controller 600. The control circuit 608 adjusts states and/or operation of the pressurized air source 602 and the variable flow valve 604 based on the mass flow rate detected by the mass flow meter 606, the volume flow rate, and/or a command signal received from the composition controller 620. The composition controller 620 may provide a target mass flow rate to the control circuit 608, which based on this information, controls operating states of the pressurized air source 602 and the variable flow valve 604 to provide the target mass flow rate out of the air flow controller 600 and to one of the manifolds 420, 511 of FIGS. 4-5. The pressurized air out of the air flow controller 600 is referred to by arrow 624.

Figure 7A:
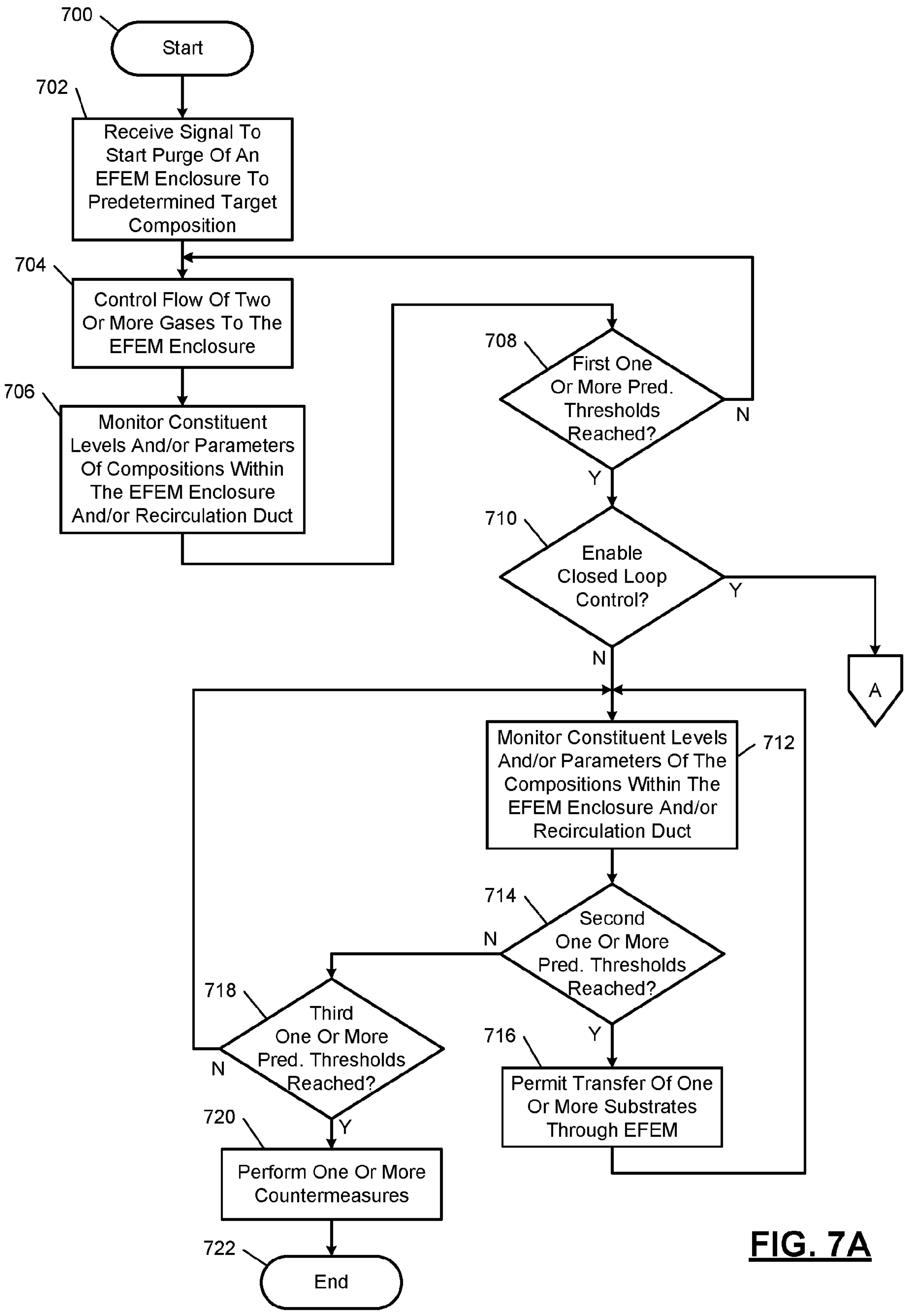
FIGS. 7A-7B illustrates an EFEM composition control method in accordance with the present disclosure.
Figure 7B:
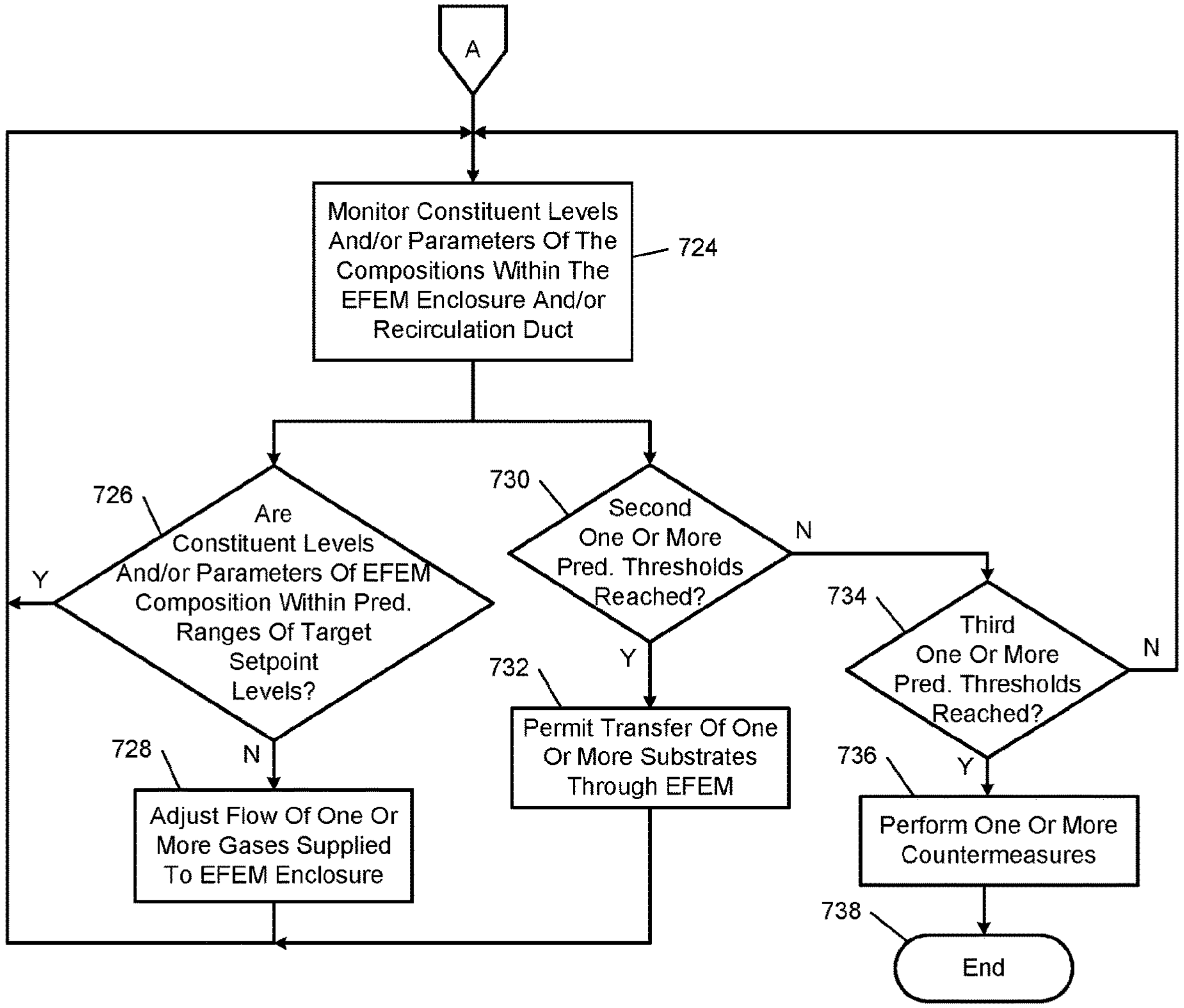

FIGS. 7A-7B shows an exemplary EFEM composition control method. The following operations may be iteratively performed. The EFEM composition control method may be implemented by a composition controller, such as one of the composition controllers 314, 414, 514 of FIGS. 3-5. The method may begin at 700. At 702, the composition controller may receive a signal to start a purge of an EFEM enclosure (e.g., one of the enclosures 302, 402, 502 of FIGS. 3-5) to transition an environment within the EFEM enclosure from having an initial composition to having a predetermined target composition.

At 704, the composition controller controls flow of two or more gasses to the EFEM enclosure, as similarly described above for the examples of FIGS. 3-5. The gases may include $N_2$, $O_2$, $CO_2$, Ar, ultra clean dry air, dehumidified air, ambient air, water vapor, etc. this operation displaces contents of the EFEM enclosure, which may include ambient air, with a nominal gas concentration of gases supplied via, for example, one of the manifolds 315, 420, 511 of FIGS. 3-5.

At 706, the composition controller monitors levels of constituents levels and/or parameters of one or more compositions within the EFEM enclosure and/or a recirculation duct of the corresponding EFEM using any of the above-described sensors. The parameters may be sensor output parameters and/or parameters generated based on sensor output parameters, such as gas constituent levels (e.g., a level of $O_2$, $N_2$, $CO_2$, etc.), a relative humidity level, temperatures, etc. In one embodiment, levels of $O_2$, temperatures and relative humidity levels are monitored. As an example, the composition controller may purge contents of the EFEM enclosure to provide X % of oxygen and Y % of relative humidity, which may require first predetermined number of liters of nitrogen and a second predetermined number of liters of ambient air, where X is a value between 0-21 and Y is a value between 0-100.

At 708, the composition controller may determine whether a first one or more thresholds have been reached indicating that the composition within the EFEM enclosure and/or the composition within the recirculation duct are within first predetermined ranges associated with the environment in the EFEM enclosure having the predetermined target composition. This may be an indication that the initial environment (or contents) within the EFEM enclosure has been displaced with the purge gases supplied during operations 704 and 706. If yes, the environment within the EFEM enclosure is approaching constitution of the incoming gases and operation 710 may be performed, otherwise 704 may be performed. The EFEM enclosure may have minor leaks and/or desorption of water may occur on walls of the enclosure. As a result, a low parts-per-million (ppm) of oxygen and water may exist in the EFEM enclosure unless higher levels of oxygen and water are purposely targeted and supplied. The following operations aid in minimizing the ppm levels of oxygen and water and/or maintaining targeted levels of oxygen and water by continuing to allow a portion of the contents within the EFEM enclosure to be exhausted via an exhaust valve while replacing the exhausted gases with supplied gases (referred to as make up gas) as described herein. This replacement of exhausted gas may be continuously performed.

At 710, the composition controller may determine whether to enable closed loop control. If no, operation 712 is performed, otherwise operation 724 is performed. The composition controller may operate in open loop control while performing operations 704, 706, and 708. The composition controller may remain in the open loop mode and perform operations 712, 714, 716, 718, 720. While in the open loop mode, the compensation controller may monitor constituent composition levels and/or other parameters (e.g., relative humidity) via the sensors to determine if these parameters are within tolerance ranges of set point values. This may be performed to determine whether an issue exists and/or whether the state of the environment in the EFEM enclosure is appropriate for transfer of substrates therethrough. Closed loop control may be performed to make corrections, as further described below. Closed loop control allows for inaccuracies in actual parameter values, which may be associated with assumptions made for open loop control, to be corrected. While in the open loop and closed loop operating modes, a positive pressure is maintained within the EFEM enclosure.

At 712, the composition controller operates in an open loop mode and may transition from operating in a rapid purge mode to operating in a slow purge (or composition maintaining) mode. This includes the composition controller monitoring constituent levels and/or parameters of the compositions within the EFEM enclosure and/or the recirculation duct.

At 714, the composition controller determines whether a second one or more predetermined thresholds have been reached. The second one or more predetermined thresholds may be the same or different than the first one or more predetermined thresholds and are associated with permitting substrate transfers through the EFEM enclosure. In one embodiment, the second one or more predetermined thresholds are associated with tighter (i.e., smaller) ranges than the first one or more predetermined ranges. If the second one or more predetermined thresholds have been reached, the EFEM enclosure may be deemed to be at steady-state and operation 716 may be performed, otherwise operation 718 may be performed. At 716, the composition controller permits transfer of one or more substrates through the EFEM enclosure.

At 718, the composition controller determines whether a third one or more predetermined thresholds have been reached. The third one or more predetermined thresholds may be associated with operating limits and/or be associated with an error, a fault, and/or a failure. For example, if one or more levels of one or more gases is out-of-range (either too high or too low), a failure may have occurred such that levels of the one or more gases is no longer in a normal operating range. For example, divergence in supply of one of the constituent gases may have occurred such that the supply of the constituent gas has dropped off or been "cut off". The third one or more predetermined thresholds may include minimum and maximum values, where: the minimum values are smaller than the corresponding minimum values of the second one or more thresholds; and the maximum values are larger than the corresponding maximum values of the second one or more thresholds. If yes, operation 720 may be performed, otherwise operation 712 may be performed.

At 720, the composition controller performs one or more countermeasures. This may include generating one or more warning and/or alarm messages and/or signals indicating the parameters that are out of range. The countermeasures may include ceasing operation and/or only permitting certain tasks to be performed until the issue is resolved. As an example, passage of substrates through the EFEM enclosure may be prevented until the issue is resolved. Subsequent to operation 720, the method may end at 722.

At 724, the composition controller operates in closed feedback loop mode and may transition from operating in a rapid purge mode to operating in a slow purge (or composition maintaining) mode. This includes the composition controller monitoring constituent levels and/or parameters of the compositions within the EFEM enclosure and/or the recirculation duct. In one embodiment, measurement of EFEM environment composition is performed to allow closed loop control of incoming gas composition to create an EFEM gas environment with specific moisture and oxygen levels.

The following operations 726, 728 may be performed in parallel with operations 730, 732, 734, 736. At 726, the composition controller determines whether the constituent levels and/or parameters of the composition within the EFEM enclosure match and/or are within predetermined ranges of target set point levels for the EFEM target composition. This may include determining whether constituent levels and/or parameters of the composition within the recirculation duct match and/or are within predetermined ranges of target set point levels of a target composition for the EFEM recirculation duct. Constituent levels and/or parameters of the composition within the recirculation duct may be monitored to indirectly determine (or estimate) the constituent levels and/or parameters of the composition within the EFEM enclosure. If not, operation 728 is performed, otherwise operation 724 is performed.

At 728, the composition controller adjusts flow of one or more gases supplied to EFEM enclosure, such that the constituent levels and/or parameters of the composition within the EFEM enclosure match and/or are within predetermined ranges of the target set point levels for the EFEM target composition. In one embodiment, flow of gases are adjusted until the $O_2$ levels and relative humidity level match and/or are within predetermined ranges of target set point levels for $O_2$ and relative humidity.

At 730, the composition controller determines whether the second one or more predetermined thresholds have been reached similarly as determined at 714. If the second one or more predetermined thresholds have been reached, the EFEM enclosure may be deemed to be at steady-state and operation 732 may be performed, otherwise operation 734 may be performed. At 732, the composition controller permits transfer of one or more substrates through the EFEM enclosure.

At 734, the composition controller determines whether the third one or more predetermined thresholds have been reached similarly as determined at 718. If yes, operation 736 may be performed, otherwise operation 724 may be performed. At 736, the composition controller performs one or more countermeasures similarly as performed at 720. Subsequent to operation 736, the method may end at 738.

The above method allows a composition within an EFEM enclosure to be precisely set at an intermediate purge level, where the EFEM enclosure is not entirely filled with a particular purge gas (e.g., nitrogen), but rather is filled partially with the particular purge gas (e.g., nitrogen) and partially with other gases (e.g., carbon dioxide, oxygen, water vapor, ultra clean dry air, dehumidified air, etc.). The systems and method provided herein allow for ratios of these gases within an EFEM enclosure to be set, monitored and adjusted. Configurable set points for water and oxygen concentrations in an EFEM enclosure are able to be set and controlled to be between a pure particular purge gas (e.g., nitrogen) environment and an ambient air environment.

Figure 8:
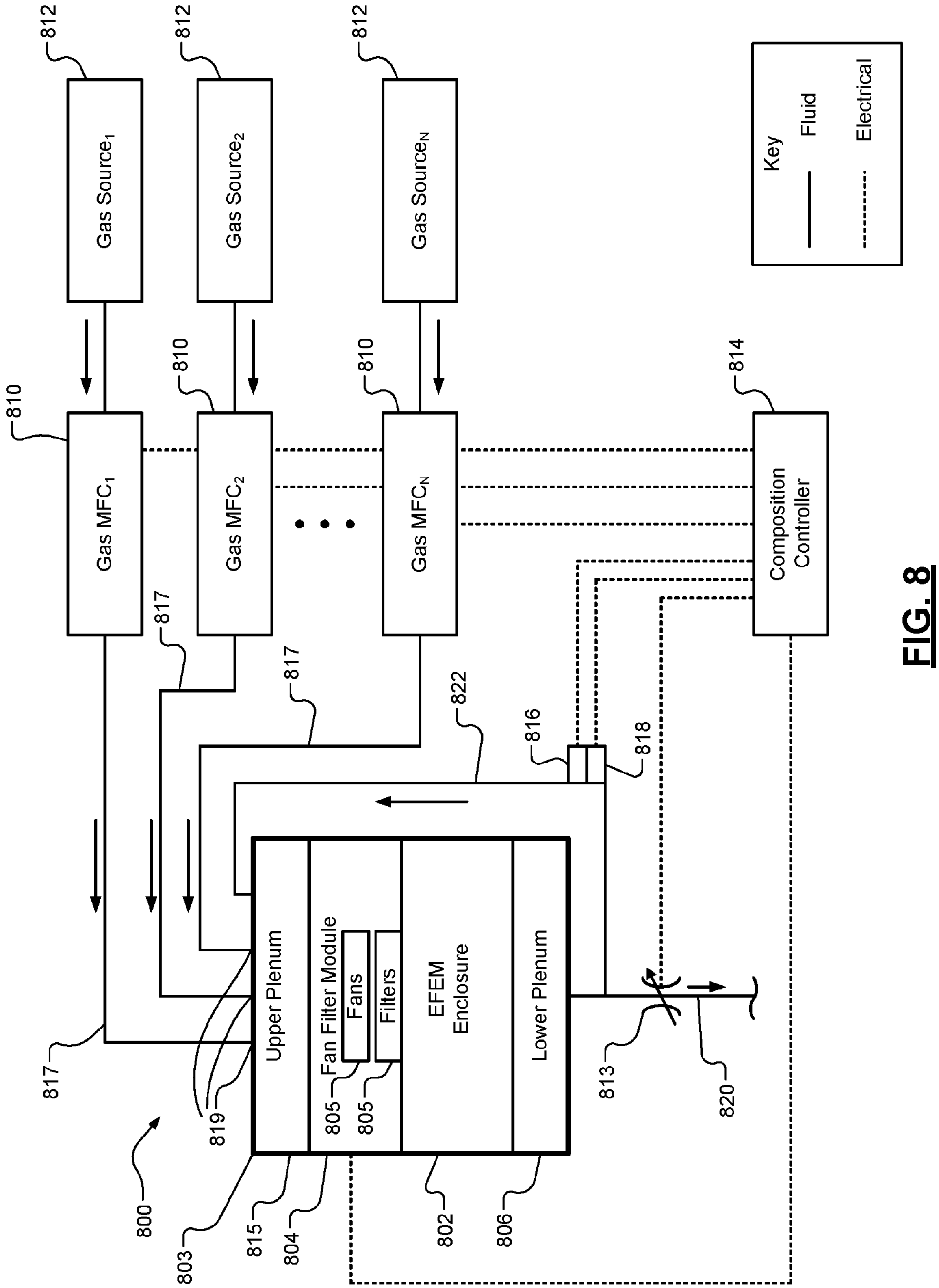
FIG. 8 is a functional block diagram of an EFEM composition mixture control system including an upper plenum in accordance with the present disclosure.

FIG. 8 shows an EFEM composition mixture control system 800 for an EFEM enclosure 802. An EFEM 803 is shown and includes the EFEM enclosure 802, a fan filter module 804, an upper plenum 815, and a lower plenum 806. The fan filter module 804 filters gases received prior to being provided into the EFEM enclosure 802. The fan filter module 804 also filters air and/or gases recirculating through the EFEM 803. The fan filter module 804 may include one or more fans 805 for moving gases into the EFEM enclosure 802. The one or more fans 805 provide laminar airflow through the EFEM enclosure 802. Purge gases may be moved into the EFEM enclosure 802 as a result of pressures of the corresponding gas sources. The upper plenum 815 receives gases from multiple MFCs 810 and/or other gas and/or fluid sources. The receives gases and/or fluids are mixed in the upper plenum 815 prior to being drawn into the EFEM enclosure 802 via the fans 805. The lower plenum 806 collects gases within the EFEM enclosure 802 and is used for controlling uniformity of air flow in the EFEM enclosure 802.

The EFEM composition mixture control system 800 includes (i) the MFCs 810 that receive gases from respective gas sources 812, and (ii) an exhaust valve 813. The MFCs 810 control flow of gases from the gas sources 812 to the upper plenum 815, which functions in combination with the connected ducts 817 as a manifold. A composition controller 814 is connected to and, based on outputs from sensors (e.g., two example sensors 816, 818 are shown), (i) controls operation of (i) the gas MFCs 810, and (ii) may control operation of the fan filter module 804 and/or the exhaust valve 813. The fan filter module 804 may include a controller that independently controls operation of the one or more fans 805 of the fan filter module 804 and/or the composition controller 814 may control operation of the one or more fans 805. Another controller may be included to independently control a state of the exhaust valve 813, which may be adjusted to control pressure within the EFEM enclosure 802. The exhaust valve 813 is a variable control valve (also referred to as a throttle valve) that is used to control the EFEM pressure by offsetting a rate of input purge and may also be used to control a rate of recirculation of air back to the EFEM enclosure 802. The opening state of the exhaust valve 813 is directly related to a flow rate of air output from the plenum 806 and exhausted via an exhaust duct 820. The exhaust valve 813 is set to control pressure during a purge from gas sources to balance volume flow of gases into the EFEM enclosure 802. Exhausting some intermediate concentration of gas may occur during this purge.

A flow rate of air output from the lower plenum 806 and recirculated back to the fan filter module 804 via a recirculation duct 822 may be controlled by controlling operation of the one or more fans 805 of the fan filter module 804. The recirculation duct 822 recirculates air received from the plenum 806 back to the fan filter module 804.

The ducts 817 separately supply gases to the upper plenum 815 via separate input ports 819 of the upper plenum 815. The upper plenum 815 mixes gases received from the gas MFCs 810 and supplies a resultant gas mixture to the fan filter module 804.

The EFEM composition mixture control system 800 may include two or more gas MFCs 810 and two or more gas sources 812. The gas sources 812 may each include one or more gases, such as nitrogen ($N_2$), oxygen ($O_2$), carbon dioxide ($CO_2$), argon (Ar), ultra clean dry air, dehumidified air, etc. The gases may be referred to as purge gases. The gas sources 812 may include pressurized gas and/or gas stored in a gas reservoir. The gas sources 812 may include blowers, fans, compressors, pressurized tanks, dehumidifiers, etc.

The composition controller 814 controls operation of the gas MFCs 810 to provide a target composition in the EFEM enclosure 802. In one embodiment, the gas MFCs 810 and the exhaust valve 813 are controlled, such that a relative humidity level within the EFEM enclosure 802 is adjusted to be between 0-100% and an $O_2$ percentage by volume of air within the EFEM enclosure 802 is 0-21% (or 0 to a percentage of $O_2$ in ambient air). This control may include monitoring states of one or more sensors (e.g., the sensors 816, 818), and based on outputs of the sensors adjusting outputs of the gas MFCs 810. Although the sensors 816, 818 are shown attached to the recirculation duct 822, the sensors 816, 818 and/or other sensors may be attached to the recirculation duct 822 and/or the EFEM enclosure 802. The sensors generate signals that are indicative of states of environments within the recirculation duct 822 and within the EFEM enclosure 802. A state of the environment within the EFEM enclosure 802 may be estimated indirectly by determining the environmental state within the recirculation duct 822. The state of the environments within the EFEM enclosure 802 and the recirculation duct 822 refers to the compositions within the EFEM enclosure 802 and the recirculation duct 822.

The sensors may include gas sensors, humidity sensors, and temperature sensors. The gas sensors may be configured to detect levels of respective gases, such as levels of $N_2$, $O_2$, $CO_2$, etc. Each humidity sensor may include an air sensor, a water sensor and a temperature sensor. The humidity sensors are used to detect levels of moisture in the recirculation duct 822 and in the EFEM enclosure 802. In one embodiment, a sensor detects a dew-point of water in air, which is a mass fraction, and also measures temperature to output a relative humidity value. The sensors may include a chromatography system for separating components of a mixture in order to detect gases of a mixture and corresponding percentages thereof. The sensors may include a residual gas analyzer (RGA) that samples a gas mixture within the EFEM enclosure 802 and/or the recirculation duct 822 and determines the elements of the gas mixture and the ratios of the elements (or gases). The RGA may determine gas molecules by volume and/or atomic gas units of the gas mixture. The RGA may include a mass spectrometer and one or more pressure sensors, such as manometers, for measuring gas pressures. The RGA may be used to measure traces of impurities. The RGA may measure pressure by sensing weight of each atom as it passes through a quadrupole. The sensors may include a heated zirconia oxygen sensor.

Temperatures in an EFEM enclosure and/or a recirculation duct may be monitored and supplied gas flow rates may be adjusted based thereon, in any of the embodiments disclosed herein, to prevent a concentration set point that results in a dew-point transition and condensation. For example, the composition controller 814 is configured to control the gas MFCs 810 to limit a moisture level of the composition in the EFEM enclosure 802 to prevent condensation in the EFEM enclosure 802. The composition controller 814 may limit a moisture set point of the EFEM enclosure 802 to prevent a dew-point set point that results in condensation in the EFEM 803 and/or the recirculation duct 822.

The composition controller 814 may implement proportional control and/or a proportional-integral-differential (PID) loop to adjust states of the gas MFCs 810 and the exhaust valve 813. In one embodiment, the composition controller 814 sets states of the gas MFCs 810 and the exhaust valve 813 based on one or more look-up tables (LUTs) relating sensor outputs to gas MFC control values. The composition controller 814 sets states of the gas MFCs 810 and the exhaust valve 813 based on a target composition having associated ratios of the gases supplied by the gas MFCs 810.

In one embodiment, the gases from the upper plenum 815 are directed to the EFEM enclosure 802 directly without passing through the FFM 804. In this example embodiment, the FFM 804 may not be included or may be bypassed. When the FFM 804 is not included or bypassed, the upper plenum 815 and the recirculation duct 822 may include respective filters for filtering the gases supplied to the EFEM enclosure 802. A fan and/or one-way valve may be connected in the recirculation duct 822 and/or a path thereof to direct gas from the outlet of the EFEM 803 to the input of the EFEM enclosure 802.

Although not shown in FIGS. 4-5, an upper plenum may be included in the embodiments of FIGS. 4-5 instead of, for example, the manifolds 412 and 511. The fluids from the MFCs 407, 409, 508, 510, the vaporizers 412, 513 and the air flow controller 507 may be supplied to the upper plenums prior to be received at the FFMs 404, 504. Thus, the manifolds disclose herein may be implemented as part of a tool, as shown in FIG. 8, or separate from the tool, as shown in FIGS. 3-5. Also, each of the manifolds may be connected to a FFM, as shown in FIG. 8, or to a recirculation duct, as shown in FIGS. 3-5.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE)

chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A composition mixture control system comprising:

an equipment front end module comprising an enclosure;

a manifold;

a plurality of flow controllers configured to control flow of respective gases to the manifold, wherein the plurality of flow controllers comprising a first gas mass flow controller configured to control flow of a first gas to the manifold and a second gas mass flow controller configured to control flow of a second gas to the manifold, the second gas is different than the first gas, and the manifold is configured to mix the gases received from the plurality of flow controllers and direct a resultant gas mixture to the enclosure in the equipment front end module; and a composition controller configured to control operation of the plurality of flow controllers to adjust a composition in the enclosure to a set target composition comprising the gases.

2. The composition mixture control system of claim 1, wherein the plurality of flow controllers are configured to receive the respective gases from a plurality of gas sources.

3. The composition mixture control system of claim 1, wherein the plurality of flow controllers comprise an air flow controller configured to control flow of ambient air to the manifold.

4. A composition mixture control system for an equipment front end module, the composition mixture control system comprising:

a manifold;

a plurality of flow controllers configured to control flow of respective gases to the manifold, wherein the manifold is configured to mix the gases received from the plurality of flow controllers and direct a resultant gas mixture to an enclosure in the equipment front end module;

a valve; and a composition controller configured to control operation of the plurality of flow controllers to adjust a composition in the enclosure to a set target composition comprising the gases, and to control a state of the valve to draw ambient air into the enclosure to mix with the resultant gas mixture.

5. The composition mixture control system of claim 4, further comprising at least one of a fan and an exhaust valve, wherein the composition controller is configured to control state of the at least one of the fan and the exhaust valve to reduce pressure at least one of at an inlet and an injection point of the enclosure and draw the ambient air into the enclosure.

6. The composition mixture control system of claim 1, further comprising an exhaust valve controlling flow of gases out of the enclosure, wherein the composition controller is configured to selectively set an opening state of the exhaust valve to adjust at least one of a pressure within the enclosure and a composition in the enclosure to the set target composition.

7. The composition mixture control system of claim 1, further comprising:

a vaporizer configured to vaporize a liquid and supply a resulting vapor to the manifold; and a liquid flow controller configured to control flow of the liquid from a liquid source to the vaporizer.

8. The composition mixture control system of claim 7, wherein the first gas mass flow controller is configured to supply the first gas to the vaporizer.

9. The composition mixture control system of claim 7, wherein the liquid comprises water.

10. The composition mixture control system of claim 1, wherein:

the first gas comprises at least one of nitrogen, carbon dioxide and argon; and the second gas comprises at least one of extreme clean dry air and dehumidified air.

11. The composition mixture control system of claim 1, further comprising a plurality of sensors configured to monitor parameters related to the composition in at least one of the enclosure and a recirculation duct, wherein the composition controller is configured to control operation of the plurality of flow controllers based on the monitored parameters to adjust flow of the gases to the manifold.

12. The composition mixture control system of claim 11, wherein the monitored parameters comprise constituent levels of the gases.

13. The composition mixture control system of claim 11, wherein the monitored parameters comprise an oxygen level and a relative humidity level in at least one of the enclosure and a recirculation duct recirculating gases from an output of the equipment front end module to an input of the equipment front end module.

14. The composition mixture control system of claim 11, wherein the composition controller is configured to at least one of:

control operation of the plurality of flow controllers independent of the monitored parameters; and at least one of permit transfer of a substrate through the enclosure and perform a countermeasure based on the monitored parameters.

15. A composition mixture control system for an equipment front end module, the composition mixture control system comprising:

a manifold;

a plurality of flow controllers configured to control flow of respective gases to the manifold, wherein the manifold is configured to mix the gases received from the plurality of flow controllers and direct a resultant gas mixture to an enclosure in the equipment front end module;

a plurality of sensors configured to monitor parameters directly related to at least one of a composition in the enclosure and a composition in a recirculation duct; and a composition controller configured to control operation of the plurality of flow controllers to adjust the composition in the enclosure to a set target composition comprising the gases, and to, while operating in an open loop mode, control operation of the plurality of flow controllers independent of the monitored parameters, and at least one of permit transfer of a substrate through the enclosure and perform a countermeasure based on the monitored parameters.

16. The composition mixture control system of claim 1, further comprising:

a fan filter module connected to the enclosure; and a recirculation duct configured to recirculate gases output from the equipment front end module to the fan filter module, wherein the fan filter module is configured to filter gases received from the manifold prior to the gases being received in the enclosure.

17. The composition mixture control system of claim 16, further comprising a plurality of sensors attached to at least one of the enclosure and the recirculation duct, the composition controller configured to control operation of the plurality of flow controllers based on outputs of the plurality of sensors.

18. The composition mixture control system of claim 1, further comprising a fan filter module connected to the enclosure and configured to filter gases received from the manifold prior to the gases being received in the enclosure, wherein the manifold is connected to the fan filter module and configured to receive gases from the plurality of flow controllers, mix the gases and supplied a mixture of the gases to the fan filter module.

19. The composition mixture control system of claim 18, further comprising a recirculation duct configured to recirculate gases output from the equipment front end module to the manifold.

20. The composition mixture control system of claim 1, further comprising a temperature sensor configured to detect a temperature within the enclosure or in a recirculation duct, wherein the composition controller is configured to control the plurality of flow controllers to limit a moisture level of the composition in the enclosure to prevent condensation in the enclosure.

21. The composition mixture control system of claim 1, wherein the equipment front end module is upstream from a vacuum transfer module and at least one processing module.

22. The composition mixture control system of claim 1, wherein the equipment front end module is configured to transfer substrates between i) at least one front opening unified pod and ii) at least one load lock.

23. A composition control method comprising:

controlling flow of gases to a manifold via a plurality of flow controllers, wherein the plurality of flow controllers comprise a first gas mass flow controller and a second gas mass flow controller;

controlling flow of a first gas to the manifold via the first gas mass flow controller;

controlling flow of a second gas to the manifold via the second gas mass flow controller, wherein the second gas is different than the first gas;

mixing the gases in the manifold to provide a resultant gas mixture;

supplying the resultant gas mixture to an enclosure in an equipment front end module; and controlling operation of the plurality of flow controllers to adjust a composition in the enclosure to a set target composition comprising the gases.

24. The composition control method of claim 23, further comprising:

monitoring constituent levels of gases in the composition in the enclosure; and based on the constituent levels, adjusting operation of the plurality of flow controllers to provide the set target composition in the enclosure.

25. The composition control method of claim 23, further comprising:

monitoring an oxygen level and a relative humidity level in the enclosure; and based on the oxygen level and the relative humidity level, adjusting operation of the plurality of flow controllers to provide the set target composition in the enclosure.

26. The composition control method of claim 23, further comprising:

recirculating gases from an output of the enclosure to an input of the enclosure via a recirculation duct;

monitoring constituent levels of gases in the recirculation duct; and based on the constituent levels, adjusting operation of the plurality of flow controllers to provide the set target composition in the enclosure.

27. The composition control method of claim 23, further comprising:

recirculating gases from an output of the enclosure to an input of the enclosure via a recirculation duct;

monitoring an oxygen level and a relative humidity level in the recirculation duct; and based on the oxygen level and the relative humidity level, adjusting operation of the plurality of flow controllers to provide the set target composition in the enclosure.

28. The composition control method of claim 23, further comprising selectively setting an opening state of an exhaust valve of the enclosure to adjust at least one of a pressure within the enclosure and a composition in the enclosure to the set target composition.

29. The composition control method of claim 23, further comprising:

receiving gases in the manifold from the plurality of flow controllers;

mixing the gases in the manifold; and supplying the resultant gas mixture of the gases from the manifold to a fan filter module; and filtering via the fan filter module the gases received from the manifold prior to the gases being received in the enclosure.

30. The composition control method of claim 29, further comprising recirculating gases output from the equipment front end module to the manifold.

31. The composition control method of claim 23, further comprising:

vaporizing via a vaporizer a liquid and supplying a resulting vapor to the manifold; and controlling flow of the liquid from a liquid source to the vaporizer to adjust a composition in the enclosure to the set target composition.

32. The composition control method of claim 31, further comprising supplying the first gas to the vaporizer via the first gas mass flow controller.

33. The composition control method of claim 31, wherein the liquid comprises water.

34. The composition control method of claim 23, wherein:

the first gas comprises at least one of nitrogen, carbon dioxide and argon; and the second gas comprises at least one of extreme clean dry air and dehumidified air.

35. The composition control method of claim 23, further comprising:

monitoring parameters related to the composition in at least one of the enclosure and a recirculation duct; and controlling operation of the plurality of flow controllers based on the monitored parameters to adjust flow of the gases to the manifold.

36. The composition control method of claim 35, wherein the monitored parameters comprise constituent levels of the gases.

37. The composition control method of claim 35, wherein the monitored parameters comprise an oxygen level and a relative humidity level in at least one of the enclosure and the recirculation duct recirculating gases from an output of the equipment front end module to an input of the equipment front end module.

38. The composition control method of claim 35, further comprising at least one of:

controlling operation of the plurality of flow controllers independent of the monitored parameters, and at least one of permitting transfer of a substrate through the enclosure and performing a countermeasure based on the monitored parameters.

39. The composition control method of claim 23, further comprising:

monitoring parameters directly related to at least one of the composition in the enclosure and a composition in a recirculation duct; and while operating in an open loop mode, controlling operation of the plurality of flow controllers independent of the monitored parameters, and at least one of permitting transfer of a substrate through the enclosure and perform a countermeasure based on the monitored parameters.

40. The composition control method of claim 23, further comprising:

detecting a temperature within the enclosure or in a recirculation duct; and controlling the plurality of flow controllers to limit a moisture level of the composition in the enclosure to prevent condensation in the enclosure.

* * * * *